United States Patent
Mokler et al.

(10) Patent No.: US 10,548,249 B2
(45) Date of Patent: Jan. 28, 2020

(54) SHIELDING IN ELECTRONIC ASSEMBLIES

(71) Applicant: Intel Corporation, Santa Clara, CA (US)

(72) Inventors: Scott Mokler, Hillsboro, OR (US);
Timothy Swettlen, Portland, OR (US);
Kevin Byrd, Lake Oswego, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/716,757

(22) Filed: Sep. 27, 2017

(65) Prior Publication Data

US 2019/0098802 A1    Mar. 28, 2019

(51) Int. Cl.
| | | |
|---|---|---|
| *H05K 9/00* | (2006.01) | |
| *H05K 1/18* | (2006.01) | |
| *H01L 23/498* | (2006.01) | |
| *H05K 3/34* | (2006.01) | |
| *H01L 23/00* | (2006.01) | |

(52) U.S. Cl.
CPC ..... *H05K 9/0028* (2013.01); *H01L 23/49816* (2013.01); *H05K 3/341* (2013.01); *H05K 3/3494* (2013.01); *H05K 9/0081* (2013.01); *H01L 23/49838* (2013.01); *H01L 24/16* (2013.01); *H01L 2224/16225* (2013.01); *H01L 2924/14* (2013.01); *H01L 2924/19041* (2013.01); *H01L 2924/19106* (2013.01); *H05K 1/181* (2013.01); *H05K 2201/09063* (2013.01); *H05K 2201/10371* (2013.01); *H05K 2201/10378* (2013.01); *H05K 2201/10734* (2013.01)

(58) Field of Classification Search
CPC .... H05K 9/0028; H05K 1/181; H05K 3/3494; H05K 3/341; H05K 9/0081; H05K 2201/10734; H05K 2201/09063; H05K 2201/10378; H01L 23/49816; H01L 2924/19041; H01L 24/16; H01L 2924/19106; H01L 23/49838
USPC .......................................................... 361/749
See application file for complete search history.

(56) References Cited

U.S. PATENT DOCUMENTS

| | | | | |
|---|---|---|---|---|
| 6,297,551 B1* | 10/2001 | Dudderar | .............. | H01L 23/055 257/686 |
| 6,489,669 B2* | 12/2002 | Shimada | ................. | H01L 23/13 257/686 |
| 6,687,135 B1* | 2/2004 | Kitade | ................. | H05K 3/3405 174/365 |
| 8,288,844 B2* | 10/2012 | Huang | ................. | H01L 21/565 257/660 |
| 2007/0127725 A1* | 6/2007 | Tominaga | ............... | H04B 1/40 381/2 |

(Continued)

OTHER PUBLICATIONS

U.S. Appl. No. 15/660,481, filed Jul. 26, 2017 Inventors Dong-Ho Han et al., entitled "Electromagnetic Interference (EMI) Shield for a Printed Circuit Board (PCB)."

*Primary Examiner* — Rockshana D Chowdhury
(74) *Attorney, Agent, or Firm* — Patent Capital Group

(57) ABSTRACT

Disclosed herein are arrangements for shielding in electronic assemblies, as well as related methods and devices. In some embodiments, an electronic assembly may include a circuit board having a first face and a second opposing face, and a shield coupled to the second face of the circuit board. The circuit board may have a hole extending therethrough, and the shield may extend into the hole towards the first face.

24 Claims, 7 Drawing Sheets

(56) References Cited

U.S. PATENT DOCUMENTS

| | | | |
|---|---|---|---|
| 2009/0016039 A1* | 1/2009 | Imamura | H05K 3/3405 |
| | | | 361/818 |
| 2011/0147901 A1* | 6/2011 | Huang | H01L 21/565 |
| | | | 257/660 |
| 2012/0182699 A1* | 7/2012 | Zhang | H05K 1/141 |
| | | | 361/742 |
| 2013/0153286 A1* | 6/2013 | Kim | H05K 9/0028 |
| | | | 174/377 |
| 2014/0071632 A1* | 3/2014 | Sunaga | H01L 23/49811 |
| | | | 361/728 |
| 2015/0348936 A1* | 12/2015 | Lin | H01L 23/552 |
| | | | 257/659 |

* cited by examiner

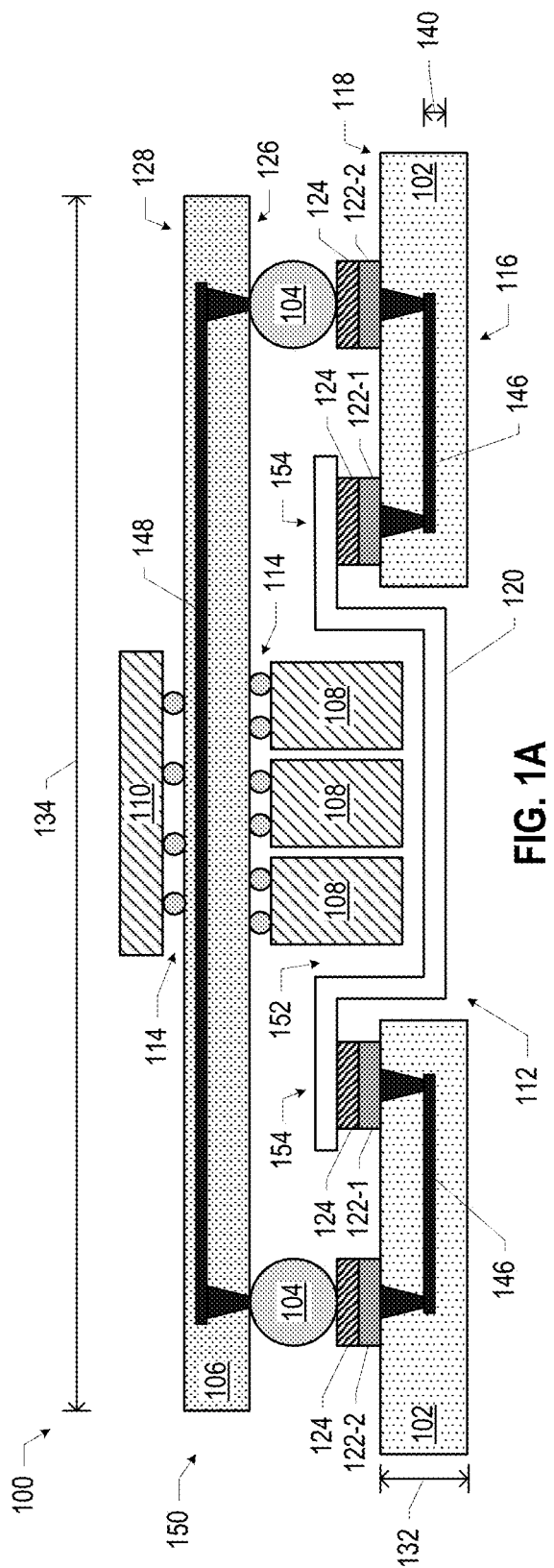
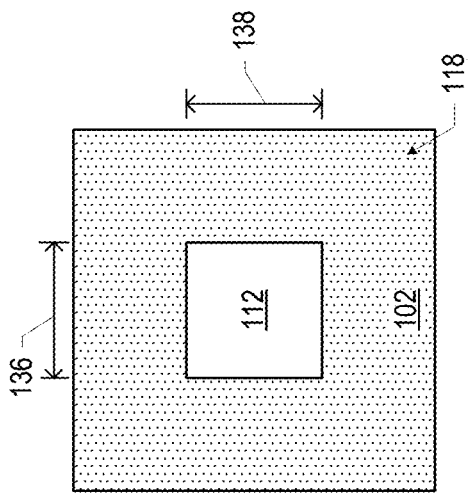
FIG. 1A
FIG. 1B

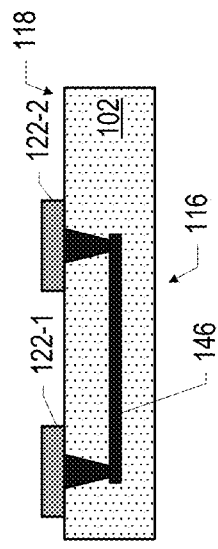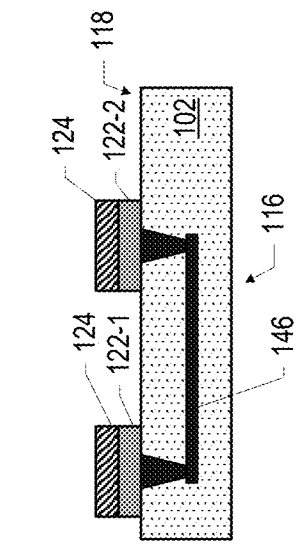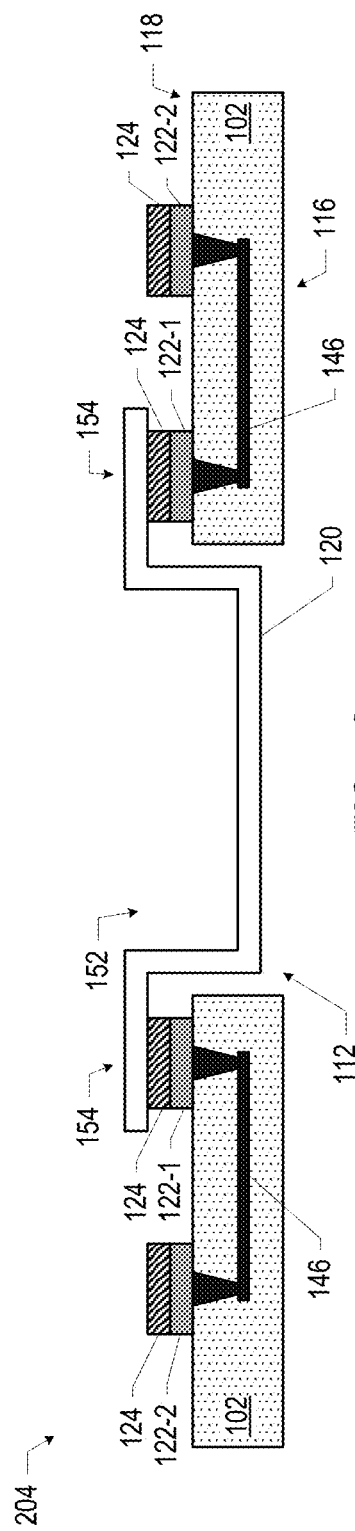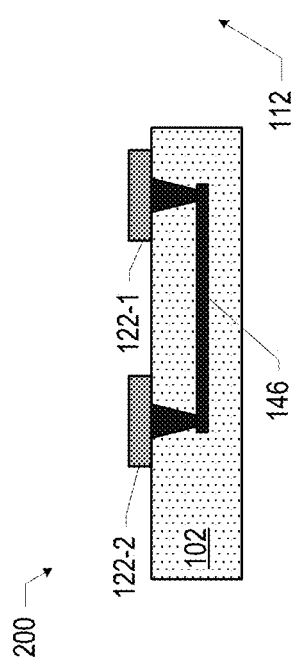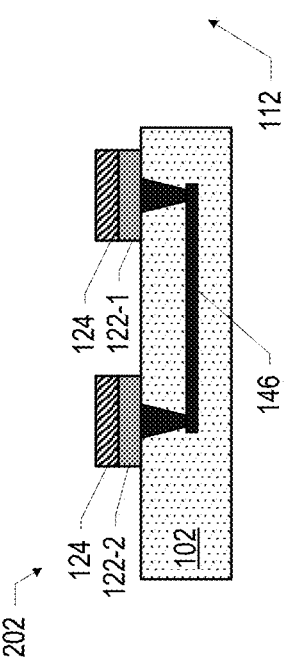
FIG. 5A
FIG. 5B
FIG. 5C

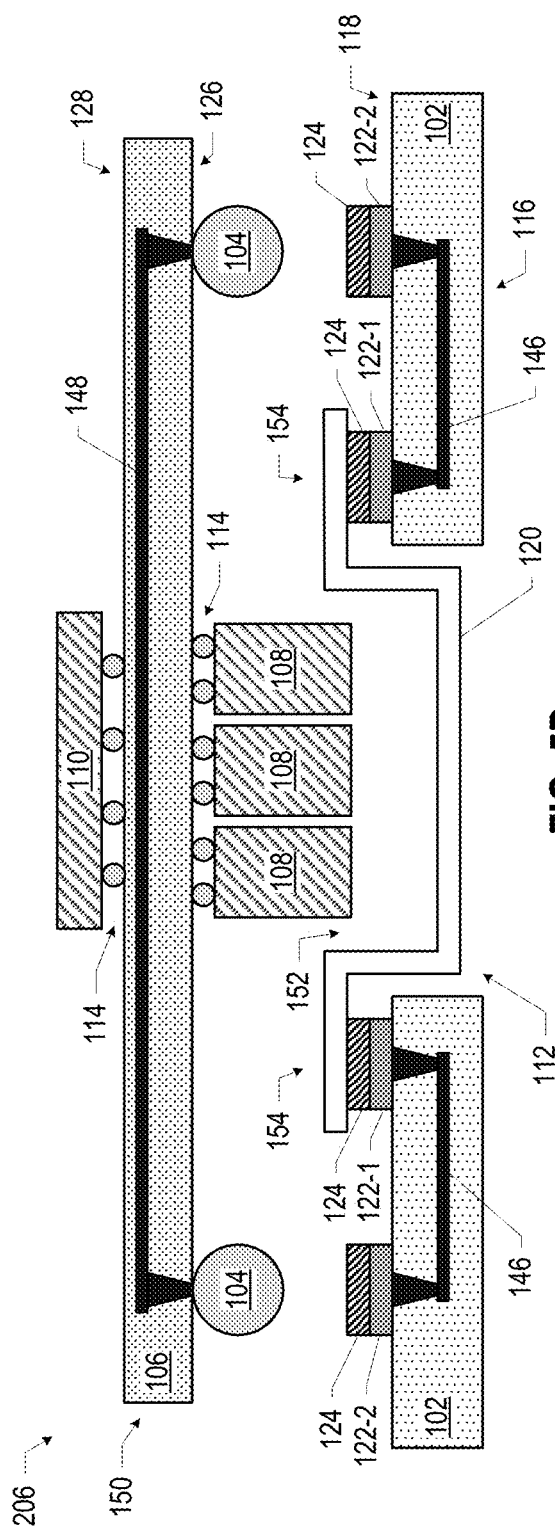
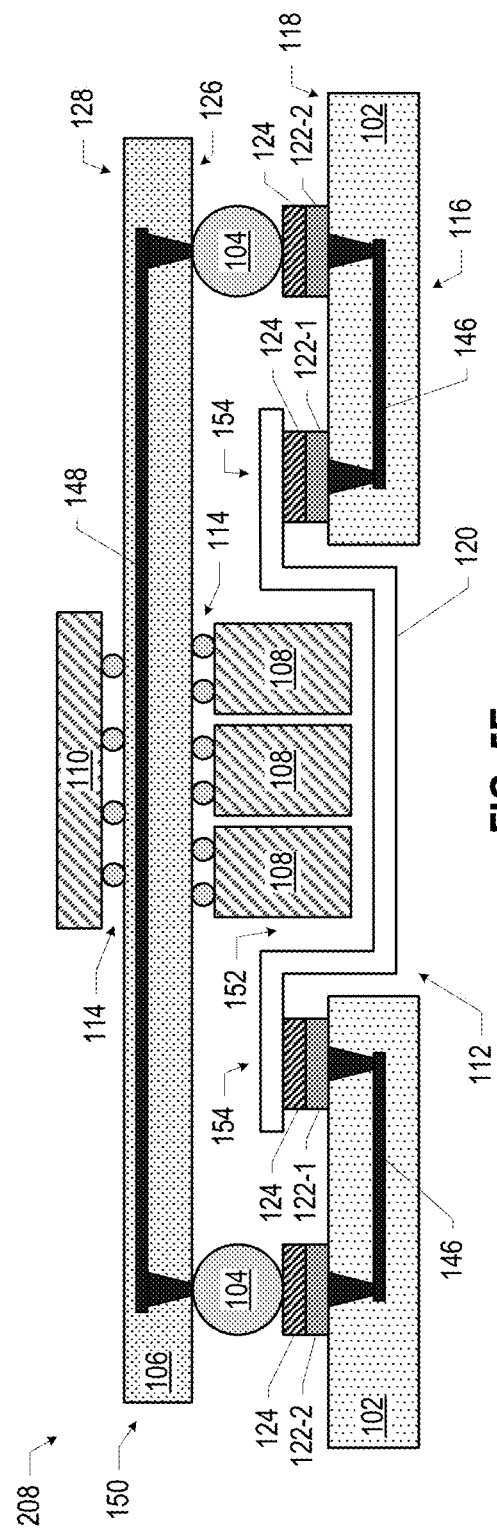
FIG. 5D
FIG. 5E

1000

Bring a shield into contact with solder material on a circuit board, wherein the circuit board has a hole extending therethrough, and the shield has a cavity that, when the shield is brought into contact with the circuit board, extends into the hole
1002

Reflow the solder material to secure the shield to the circuit board
1004

SHIELDING IN ELECTRONIC ASSEMBLIES

BACKGROUND

Electromagnetic shields may be used in some computing devices to protect sensitive circuitry from electromagnetic interference that may disrupt operation of the circuitry or to constrain the electromagnetic interference generated by an especially "noisy" component.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, not by way of limitation, in the figures of the accompanying drawings.

FIGS. 1A-1B are views of an example electronic assembly including a shield, in accordance with various embodiments.

FIGS. 5A-5E illustrate stages in an example process of manufacturing an electronic assembly with a shield, in accordance with various embodiments.

DETAILED DESCRIPTION

Figure 2:
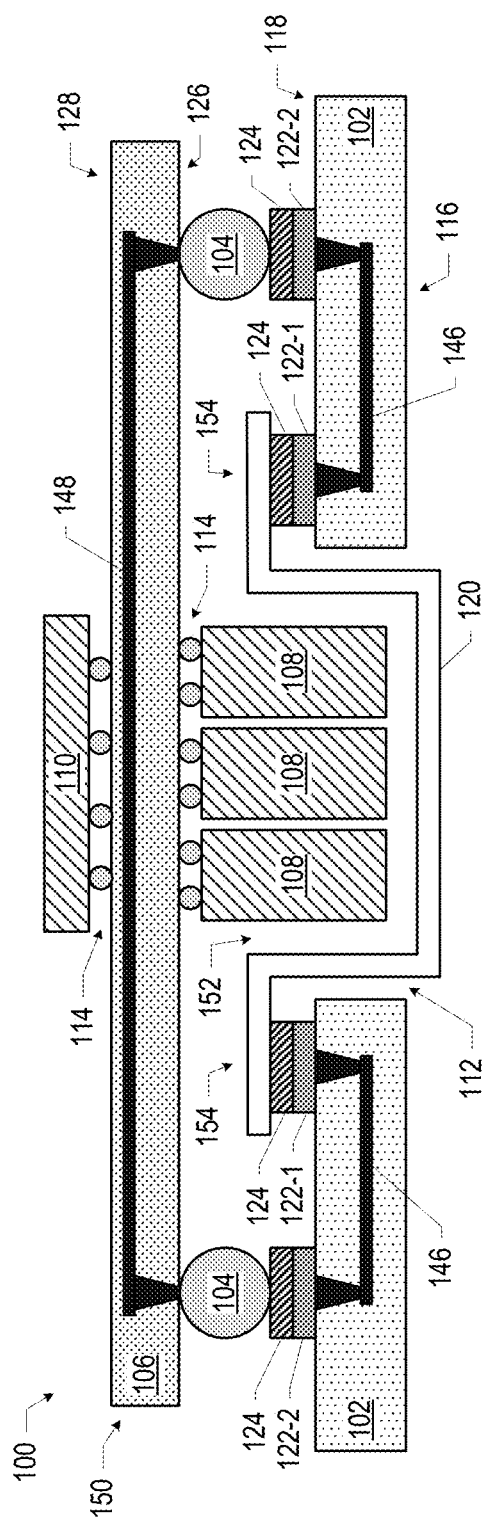
FIGS. 2-4 are side cross-sectional views of example electronic assemblies including shields, in accordance with various embodiments.

Disclosed herein are arrangements for shielding in electronic assemblies, as well as related methods and devices. In some embodiments, an electronic assembly may include a circuit board having a first face and a second opposing face, and a shield coupled to the second face of the circuit board. The circuit board may have a hole extending therethrough, and the shield may extend into the hole towards the first face.

In some electronic circuits, an integrated circuit (IC) package (e.g., including electronic components on one or both sides of the package substrate) may be mounted on a circuit board. The total z-height of such an assembly may include the thickness of the circuit board, the thickness of the IC package, and any additional thickness provided by the interconnects between the IC package and the circuit board. In order to reduce the z-height of such an assembly, a circuit board may include a hole into which electronic components on the "bottom" of the IC package may extend. By allowing such electronic components to extend into a hole in the circuit board, the package substrate and the circuit board may be brought closer together, reducing the z-height. A circuit board having a hole may be referred to as a "chasmic" circuit board.

However, the electronic components that extend into the hole may require electromagnetic shielding in order to mitigate undesirable electromagnetic interference (EMI) (e.g., generated by or sensed by the electronic components). Mounting a shield to the "bottom" of the circuit board may further increase the z-height of the assembly, compromising the height reduction achieved by including the hole. Mounting a shield to the bottom (or "backside") of the circuit board may result in an irregular surface at the bottom of the circuit board, which may make it difficult to position the assembly within a larger device. Further, mounting a shield to the bottom of the circuit board may require an additional surface mount (SMT) reflow operation, separate from the SMT reflow operation performed to secure the IC package to the top of the circuit board, increasing manufacturing time and cost.

Disclosed herein are electromagnetic shields and/or thermal management structures that may be used in an electronic assembly with chasmic circuit boards. Various ones of these embodiments may maintain a desirably low z-height of the assembly and/or reduce manufacturing complexity relative to "backside EMI shielding" approaches. The resulting assemblies may thus be particularly suitable for ultra-low-profile and/or small form factor applications (e.g., laptops, handheld computing devices, wearable computing devices, etc.).

The term "shield" may be used in this description to describe various ones of the conductive structures disclosed herein, but any of the shields disclosed herein may be used for purposes different from, or in addition to, EMI shielding. For example, the conductive structures described herein as "shields" may instead be used for thermal management (e.g., as a heat fin or spreader). Thus, it will be understood that any of the conductive structures described herein as "shields" may alternately or additionally be used in an IC component for other purposes.

In the following detailed description, reference is made to the accompanying drawings that form a part hereof wherein like numerals designate like parts throughout, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The drawings are not necessarily to scale. Although many of the drawings illustrate rectilinear structures with flat walls and right-angle corners, this is simply for ease of illustration and actual devices made using these techniques will exhibit rounded corners, surface roughness, and other features.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. As used herein, a "package" and an "IC package" are synonymous. When used to describe a range of dimensions, the phrase "between X and Y" represents a range that includes X and Y. For convenience, the phrase "FIG. 1" may be used to refer to the collection of drawings of FIGS. 1A-1B, the phrase "FIG. 5" may be used to refer to the collection of drawings of FIGS. 5A-5E, etc.

FIG. 1 provides various views of an electronic assembly 100. In particular, FIG. 1A is a side cross-sectional view, and FIG. 1B is a top view of the circuit board 102.

The electronic assembly 100 of FIG. 1 includes a circuit board 102, a shield 120, and an IC package 150. The circuit board 102 may have a first face 116 and an opposing second face 118. The circuit board 102 may include a dielectric material and may have conductive pathways extending through the dielectric material between the first face 116 and the second face 118, or between different locations on the first face 116, and/or between different locations on the second face 118. These conductive pathways may take the form of any of the interconnect structures 1628 discussed below with reference to FIG. 8. One or more IC packages 150, and other electronic components as desired, may be coupled to the second face 118 of the circuit board 102 via conductive contacts of the IC packages 150 (not shown), second-level interconnects 104, solder paste 124, and conductive contacts 122-2 of the circuit board 102. The conductive contacts 122-2 may themselves be coupled to conductive pathways through the circuit board 102, allowing circuitry within the IC package 150 to electrically couple to various other ones of the conductive contacts 122 of the circuit board 102 (or to devices coupled to or included in the circuit board 102, not shown). In some embodiments, electronic components (not shown) may be disposed on the first face 116. As used herein, a "conductive contact" may refer to a portion of conductive material (e.g., metal) serving as an electrical interface between different components; conductive contacts may be recessed in, flush with, or extending away from a surface of a component and may take any suitable form (e.g., a contact pad, pedestal, or socket).

The second-level interconnects 104 illustrated in FIG. 1 are solder balls (e.g., when the IC package 150 is a ball grid array (BGA) package), but any suitable second-level interconnects 104 may be used (e.g., pins in a pin grid array arrangement or lands in a land grid array arrangement). The IC package 150 may be, for example, a flip chip package, a BGA package (e.g., an embedded wafer-level ball grid array (eWLB) package), a wafer-level chip scale package (WLCSP), or a panel fanout (FO) package.

A hole 112 may extend through the circuit board 102. FIG. 1B depicts the hole 112 as having a square footprint, but this is simply an example, and the hole 112 may have a footprint of any shape (e.g., rectangular or circular). The circuit board 102 may be a printed circuit board (PCB), including multiple metal layers separated from one another by layers of dielectric material and interconnected by electrically conductive vias. In some embodiments, the circuit board 102 may be a motherboard (e.g., in a computing device, as discussed below). In some embodiments, the circuit board 102 may be an interposer. In some embodiments, the circuit board 102 may be a non-PCB substrate.

The shield 120 may have a peripheral region 154 and a cavity 152. In some embodiments, the shield 120 may be formed by stamping a metal sheet to form the cavity 152, as discussed further below. The shield 120 may be coupled to the second face 118 of the circuit board 102 and may extend into the hole 112, towards the first face 116. In particular, in some embodiments, the peripheral region 154 of the shield 120 may be coupled to multiple conductive contacts 122-1 at the second face 118 with solder paste 124; these conductive contacts 122-1 may be proximate to the hole 112 such that the cavity 152 of the shield 120 extends into the hole 112. The cavity 152 may thus be at least partially in the hole 112 (and in some embodiments, may extend farther, as discussed below with reference to FIG. 2). While solder and solder paste may be discussed as examples herein, any suitable conductive and/or adhesive materials may be used to provide interconnects between different elements in an electronic assembly 100 (e.g., between the shield 120 and the circuit board 102, between the shield 120 and the package substrate 106, between the package substrate 106 and the circuit board 102, between the electronic components 108 and the package substrate 106, or between the electronic components 110 and the package substrate 106, as suitable).

The shield 120 may be formed of a conductive material. For example, in some embodiments, the shield 120 may include steel (e.g., the shield 120 may be stamped from cold rolled steel), tin, aluminum (e.g., tin-plated aluminum), nickel silver, another metal, or any other suitable conductive material. The shield 120 may thus provide a portion of an electromagnetic shield, as discussed further below. In some embodiments, the shield 120 may serve as a heat spreader or heat sink, in addition to or instead of serving as an electromagnetic shield; some such embodiments are discussed in further detail below with reference to FIG. 4.

The IC package 150 may include a package substrate 106 having a first face 126 and an opposing second face 128. The package substrate 106 may include a dielectric material and may have conductive pathways extending through the dielectric material between the first face 126 and the second face 128, or between different locations on the first face 126, and/or between different locations on the second face 128. These conductive pathways may take the form of any of the interconnect structures 1628 discussed below with reference to FIG. 8. The IC package 150 may include one or more electronic components 108 coupled to the first face 126 of the package substrate 106 via conductive contacts of the electronic components (not shown), first-level interconnects 114, and conductive contacts of the package substrate 106 (not shown). The conductive contacts to which the first-level interconnects 114 are coupled may themselves be coupled to conductive pathways through the package substrate 106, allowing circuitry within the electronic components 108 to electrically couple to various other ones of the conductive contacts of the package substrate 106 (or to devices included in the package substrate 106, not shown). The first-level interconnects 114 illustrated in FIG. 1 are solder bumps, but any suitable first-level interconnects 114 may be used.

One or more electronic components 108 may be disposed on (e.g., electrically coupled to conductive contacts on) the first face 126; these electronic components 108 may be referred to as "land side" components. One or more of these electronic components 108 may extend into the cavity 152 of the shield 120. The particular number and arrangement of electronic components 108 in FIG. 1 is simply illustrative, and any suitable number and arrangement may be used (e.g., a single electronic component 108). For example, other electronic components (not shown) that do not extend into the cavity 152 may be disposed on the first face 126 of the package substrate 106. In some embodiments, the electronic components 108 may include dies (e.g., silicon-based dies), passive elements such as capacitors and inductors, power circuitry such as voltage regulators, or any other component that may benefit from the electromagnetic shielding/heat management that may be provided by the shield 120. In some embodiments, an underfill material (not shown) may be disposed between the electronic components 108 and the package substrate 106 around the first-level interconnects 114, and a mold compound (not shown) may be disposed around the electronic components 108 and in contact with the package substrate 106. Epoxy mold materials may be used for an underfill material and/or a mold compound, for example.

The IC package 150 may be coupled to the second face 118 of the circuit board 102. In particular, in some embodiments, the package substrate 106 may be coupled to conductive contacts 122-2 (and solder paste 124) on the second face 118 of the circuit board 102 by second-level interconnects 104 on the first face 126 of the package substrate 106. In some embodiments, the first face 126 of the package substrate 106 may also be coupled to the shield 120 (e.g., as discussed below with reference to FIG. 4). In some embodiments, the IC package 150 may include one or more electronic components 110 disposed on the second face 128 of the package substrate 106 and coupled to the second face 128 by first-level interconnects 114. A single such electronic component 110 is depicted in FIG. 1, but this is simply illustrative, and more or fewer electronic components 110 may be disposed on the second face 128. In some embodiments, an underfill material (not shown) may be disposed between the electronic components 110 and the package substrate 106 around the first-level interconnects 114, and a mold compound (not shown) may be disposed around the electronic components 110 and in contact with the package substrate 106.

The electronic assembly 100 may also include conductive pathways through the circuit board 102 and/or the package substrate 106 that may, in combination with the shield 120, provide an electromagnetic shield around the electronic components 108 in the cavity 152 of the shield 120. For example, in the embodiment of FIG. 1, conductive pathways 146 are shown extending through the circuit board 102 from the conductive contacts 122-1 to the conductive contacts 122-2, and a conductive pathway 148 is shown extending through the package substrate 106 between the second-level interconnects 104 in conductive contact with the conductive contacts 122-2. Together, the shield 120, the conductive pathways 146 and 148, and the intervening conductive contacts 122, solder paste 124, and second-level interconnects 104 may provide an electromagnetic shield around the electronic components 108 in the embodiment of FIG. 1. The conductive pathways 146 and 148 may include any suitable interconnect structures, such as conductive lines and vias (e.g., as discussed below with reference to FIG. 7). FIG. 1 depicts a particular arrangement and orientation of conductive lines and vias to provide the conductive pathways 146 and 148, but this is simply illustrative, and any suitable conductive pathways may be used.

The dimensions of the electronic assemblies 100 disclosed herein may take any suitable values. In some embodiments, the thickness 132 of the circuit board 102 may be between 0.3 millimeters and 2 millimeters (e.g., between 0.4 millimeters and 1.2 millimeters, or between 0.8 millimeters and 1.2 millimeters). In some embodiments, the width 136 and/or the length 138 of the hole 112 may be between 3 millimeters and 20 millimeters (e.g., between 5 millimeters and 15 millimeters, or between 10 millimeters and 15 millimeters). In some embodiments, the footprint of the hole 112 (provided by the width 136 and the length 138) may be less than 20 millimeters by 20 millimeters (e.g., less than 15 millimeters by 15 millimeters, or between 5 millimeters by 5 millimeters and 15 millimeters by 15 millimeters). In some embodiments, the width 134 of the package substrate 106 may be between 15 millimeters and 50 millimeters (e.g., between 15 millimeters and 30 millimeters, or between 20 millimeters and 30 millimeters). In some embodiments, the footprint of the package substrate 106 (provided by the width 134 and the length of the package substrate 106, not shown but oriented into and out of the plane of the drawing of FIG. 1A) may be less than 50 millimeters by 50 millimeters (e.g., less than 30 millimeters by 30 millimeters, or between 15 millimeters by 15 millimeters and 30 millimeters by 30 millimeters). In some embodiments, the thickness 140 of the shield 120 at the "bottom" of the cavity 152 may be between 75 microns and 200 microns (e.g., between 100 microns and 150 microns).

As noted above, in some embodiments, the circuit board 102 may be an interposer. Generally, an interposer may spread a connection to a wider pitch or reroute a connection to a different connection. In some embodiments, an interposer may be formed as a printed circuit board (PCB), including multiple metal layers separated from one another by layers of dielectric material and interconnected by electrically conductive vias. In some embodiments, an interposer may be formed of an epoxy resin, a fiberglass-reinforced epoxy resin, an epoxy resin with inorganic fillers, a ceramic material, or a polymer material such as polyimide. In some embodiments, an interposer may be formed of alternate rigid or flexible materials that may include the same materials described above for use in a semiconductor substrate, such as silicon, germanium, and other group III-V and group IV materials. An interposer may include metal lines and vias, including but not limited to through-silicon vias (TSVs). An interposer may further include embedded devices (e.g., capacitors, decoupling capacitors, resistors, inductors, fuses, diodes, transformers, sensors, electrostatic discharge (ESD) devices, and memory devices).

Figure 3:
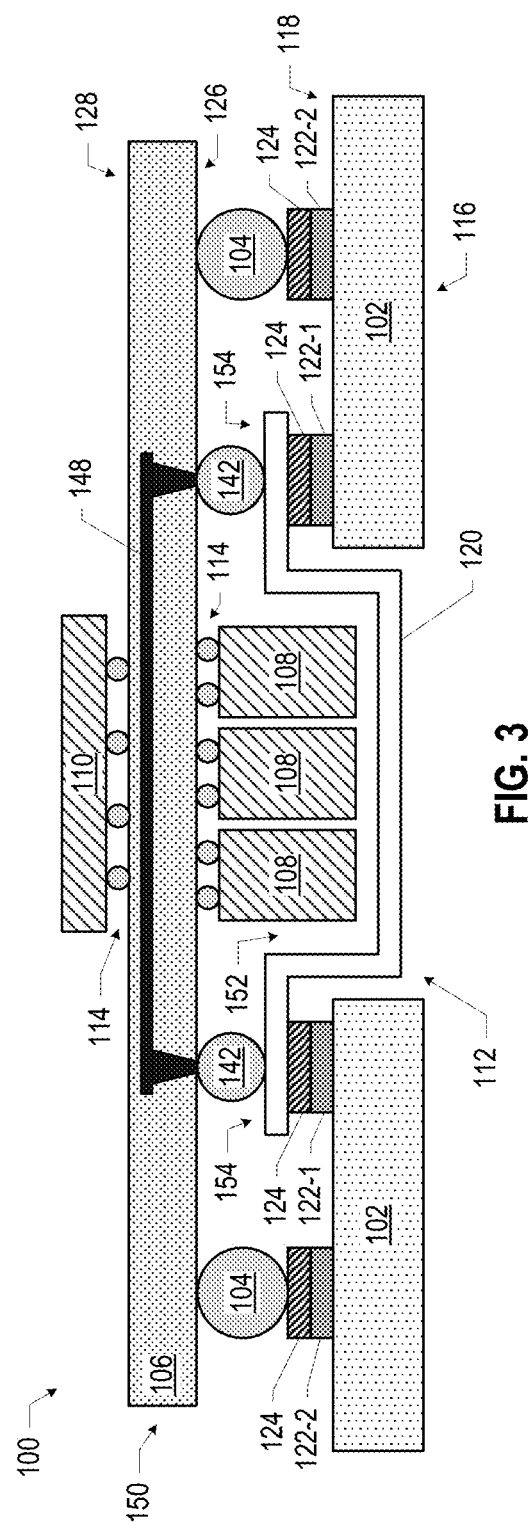
Figure 4:
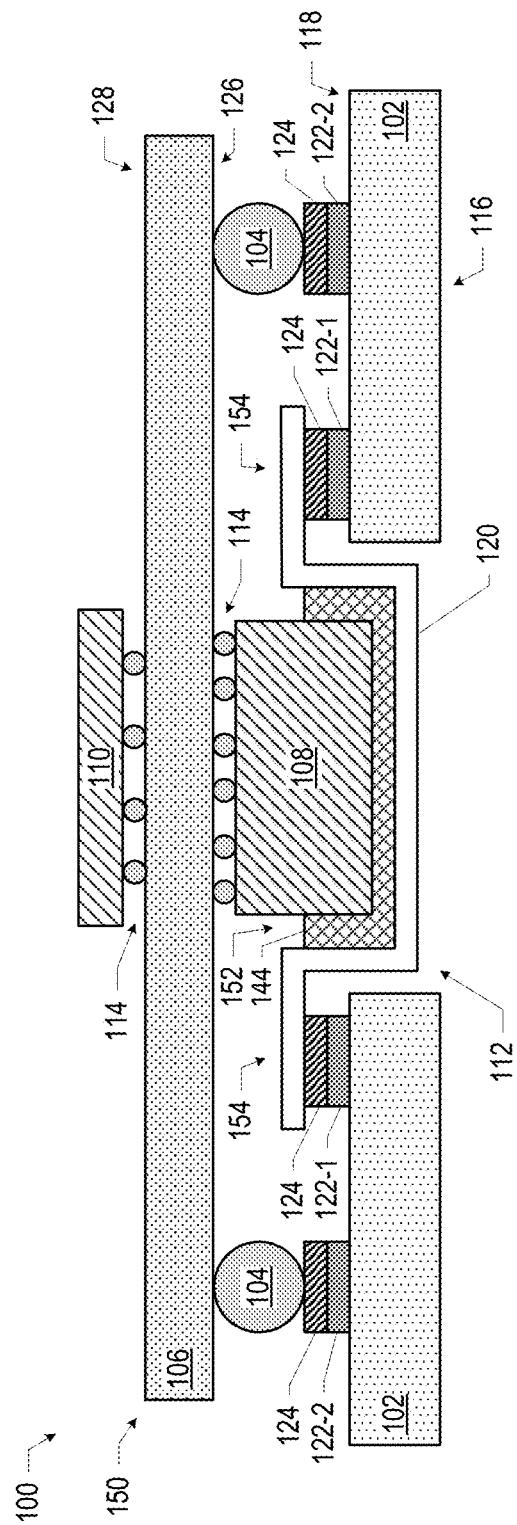

FIGS. 2-4 illustrate additional example electronic assemblies 100. Any of the features discussed with reference to any of FIGS. 1-4 herein may be combined with any other features to form an electronic assembly 100. For example, as discussed further below, FIG. 2 illustrates an embodiment in which the shield 120 extends beyond the plane of the first face 116 of the circuit board 102, and FIG. 3 illustrates an embodiment in which the shield 120 is mechanically and electrically coupled directly to the IC package 150. These features of FIGS. 2 and 3 may be combined so that an electronic assembly 100 includes a shield 120 that extends beyond the plane of the first face 116 of the circuit board 102 and is mechanically and electrically coupled directly to the IC package 150. This particular combination is simply an example, and any combination may be used. A number of elements of FIG. 1 are shared with FIGS. 2-4; for ease of discussion, a description of these elements is not repeated, and these elements may take the form of any of the embodiments disclosed herein. For example, dimensions of any of the elements of the electronic assemblies 100 of FIGS. 2-4 may take any of the values disclosed herein.

In the electronic assembly 100 of FIG. 1, the shield 120 extends into the hole 112 but does not extend past the plane of the first face 116 of the circuit board 102. In other embodiments, the shield 120 may extend beyond the plane of the first face 116. FIG. 2 illustrates an example of such an embodiment. Having the shield 120 extend beyond the plane of the first face 116 may allow the cavity 152 to be "deeper" to accommodate "taller" electronic components 108.

In the electronic assembly 100 of FIG. 1, conductive pathways 146 within the circuit board 102 are part of the conductive "loop" that includes the shield 120 and surrounds the electronic components 108 in the cavity 152. In other embodiments, the conductive "loop" may not include conductive pathways within the circuit board 102. For example, FIG. 3 illustrates an electronic assembly 100 in which the shield 120 is electrically and mechanically coupled to the package substrate 106 of the IC package 150 by a second-level interconnects 142. These second-level interconnects 142 may have a different size than the second-level interconnects 104 (e.g., the second-level interconnects 142 may be smaller solder balls than the second-level interconnects 104), but more generally, the second-level interconnects 142 may have any desired form. The second-level interconnects 142 may make electrical contact with the peripheral regions 154 of the shield 120, and a conductive pathway 148 through the package substrate 106 may complete the conductive "loop" around the electronic components 108.

As noted above, in some embodiments, the shield 120 may perform thermal management functions in addition to or instead of acting as an electromagnetic shield. For example, FIG. 4 illustrates an electronic assembly 100 in which a thermal interface material 144 is disposed between the shield 120 and the electronic components 108 in the cavity 152. The thermal interface material 144 may include a thermally conductive material (e.g., metal particles) in a polymer or other binder. The thermal interface material 144 may be a thermal interface material paste or a thermally conductive epoxy (which may be a fluid when applied and may harden upon curing, as known in the art). The thermal interface material 144 may provide a path for heat generated by the electronic components 108 to readily flow to the shield 120, where it may be spread and/or dissipated. In this manner, the shield 120 may act as a heat spreader or sink. In some embodiments, the shield 120 may include fins or other cooling features. In FIG. 4, no conductive pathways 146 are present in the circuit board 102, and no conductive pathways 148 are present in the package substrate 106; in other embodiments, conductive pathways 146 and/or conductive pathways 148 may be included in the electronic assembly 100 (e.g., when the shield 120 is to be part of an electromagnetic shield around the electronic components 108).

Electronic assemblies 100 disclosed herein may be formed using any suitable techniques. For example, FIGS. 5A-5E illustrate various stages in an example process of manufacturing the electronic assembly 100 of FIG. 1. Modifications may be made to the example process as suitable to manufacture other ones of the electronic assemblies 100 disclosed herein; some of these modifications are discussed below.

FIG. 5A is a side cross-sectional view of an assembly 200 including a circuit board 102 with a hole 112. The circuit board 102 may include conductive contacts 122 on the second face 118 and conductive pathways 146 joining various ones of the conductive contacts 122, as discussed above with reference to FIG. 1.

FIG. 5B is a side cross-sectional view of an assembly 202 subsequent to providing solder paste 124 on the conductive contacts 122 of the assembly 200 (FIG. 5A). In embodiments in which the shield 120 need not be electrically coupled to the circuit board 102, a non-conductive adhesive may be provided on the conductive contacts 122-1 instead of a solder paste 124; further, the conductive contacts 122-1 need not be present.

FIG. 5C is a side cross-sectional view of an assembly 204 subsequent to bringing the peripheral region 154 of the shield 120 into contact with the solder paste 124 on the conductive contacts 122-1 of the assembly 202 (FIG. 5B). The shield 120 may extend into the hole 112; in some embodiments, the cavity 152 may extend into the hole 112. In some embodiments, a pick-and-place machine may be used to position the shield 120. The shield 120 may be separately manufactured using any suitable technique. For example, in some embodiments, a sheet of conductive material (e.g., a metal) may be stamped repeatedly in an array to form a corresponding array of cavities 152, and then the sheet may be cut to separate the cavities into separate shields 120. In some embodiments, a thermal interface material 144 may be dispensed in the cavity 152 at this stage (not shown).

FIG. 5D is a side cross-sectional view of an assembly 206 subsequent to bringing the IC package 150 close to contact with the assembly 204 (FIG. 5C). A pick-and-place machine may be used to position the IC package 150 relative to the assembly 204. The IC package 150 may include the second-level interconnects 104, which may align with the conductive contacts 122-2 of the circuit board 102. When the package substrate 106 of the IC package 150 is to be in direct mechanical and electrical contact with the shield 120 (e.g., as discussed above with reference to FIG. 3), the IC package 150 may further include additional second-level interconnects 142 that align with the peripheral region 154 of the shield 120.

FIG. 5E is a side cross-sectional view of an assembly 208 subsequent to bringing the IC package 150 into contact with the circuit board 102 of the assembly 206 (FIG. 5D) and applying heat to reflow the second-level interconnects 104 and the solder paste 124 to electrically and mechanically secure the IC package 150 to the circuit board 102 upon cooling. The heat may also cause the solder paste 124 on the conductive contacts 122-1 to reflow, securing the shield 120 to the circuit board 102 upon cooling. The assembly 208 may take the form of the electronic assembly 100 of FIG. 1.

Figures 6, 7:
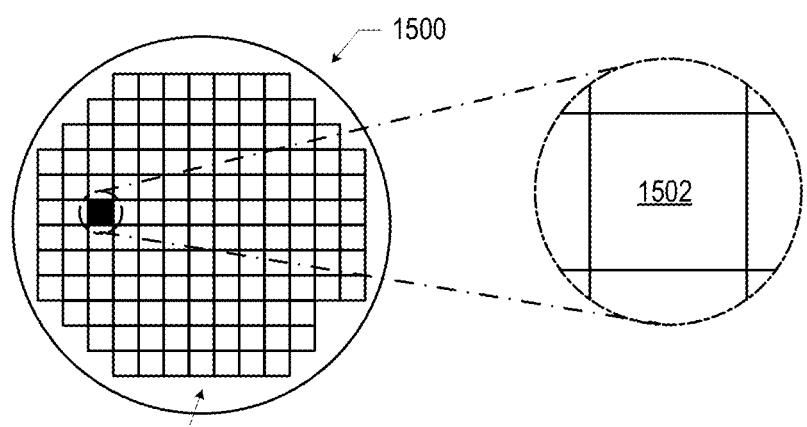
FIG. 6 is a flow diagram of a method of manufacturing a vertical capacitor in an integrated circuit (IC) component, in accordance with various embodiments.
FIG. 7 is a top view of a wafer and dies that may be included in an electronic assembly with a shield, in accordance with any of the embodiments disclosed herein.

FIG. 6 is a flow diagram of a method 1000 of manufacturing an electronic assembly including a shield, in accordance with various embodiments. Although the operations of the method 1000 may be illustrated with reference to particular embodiments of the electronic assemblies 100 disclosed herein, the method 1000 may be used to form any suitable electronic assembly. Operations are illustrated once each and in a particular order in FIG. 6, but the operations may be reordered and/or repeated as desired (e.g., with different operations performed in parallel when manufacturing multiple electronic assemblies simultaneously).

At 1002, a shield may be brought into contact with solder material on a circuit board. The circuit board may have a hole extending therethrough, and the shield may have a cavity that, when the shield is brought into contact with the circuit board, extends into the hole. For example, a shield 120 may be brought into contact with solder paste 124 on a conductive contact 122-1 of a circuit board 102. The circuit board 102 may have a hole 112, and the shield 120 may have a cavity 152 that extends into the hole 112 (e.g., as discussed above with reference to FIG. 5C).

At 1004, the solder material may be reflowed to secure the shield to the circuit board. For example, the solder paste 124 may be heated and then allowed to cool, securing the shield 120 to the circuit board 102 (e.g., as discussed above with reference to FIG. 5E).

Figure 8:
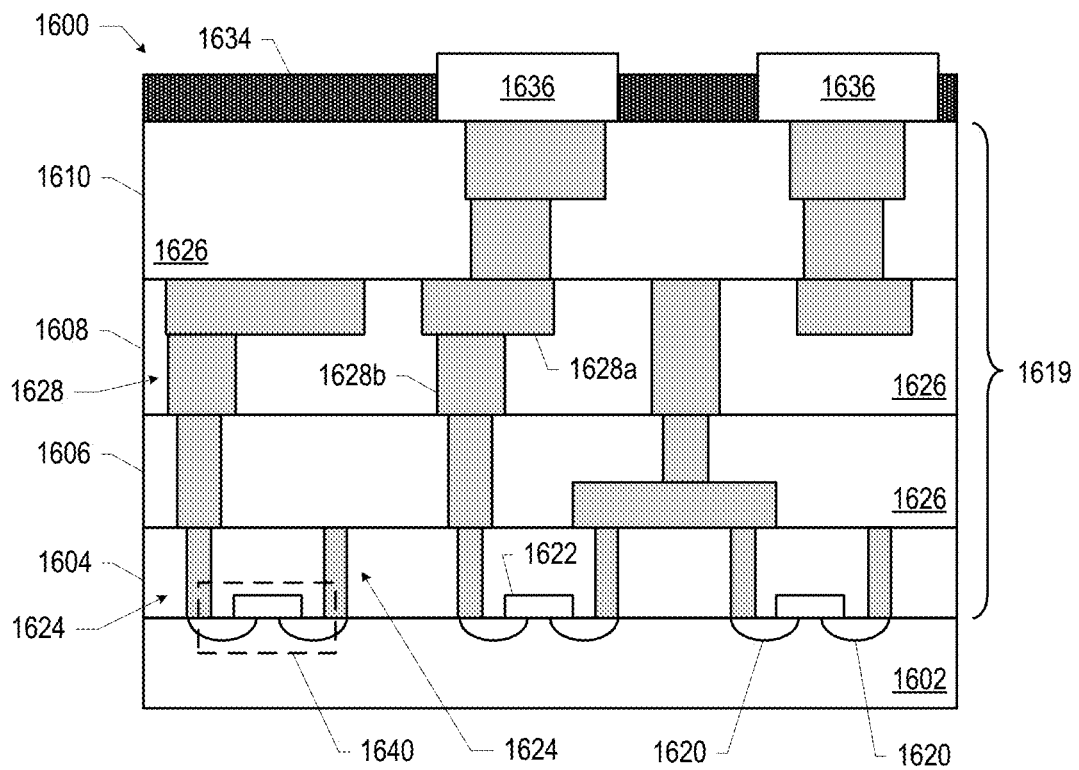
FIG. 8 is a cross-sectional side view of an IC device that may be included in an electronic assembly with a shield, in accordance with any of the embodiments disclosed herein.
Figure 9:
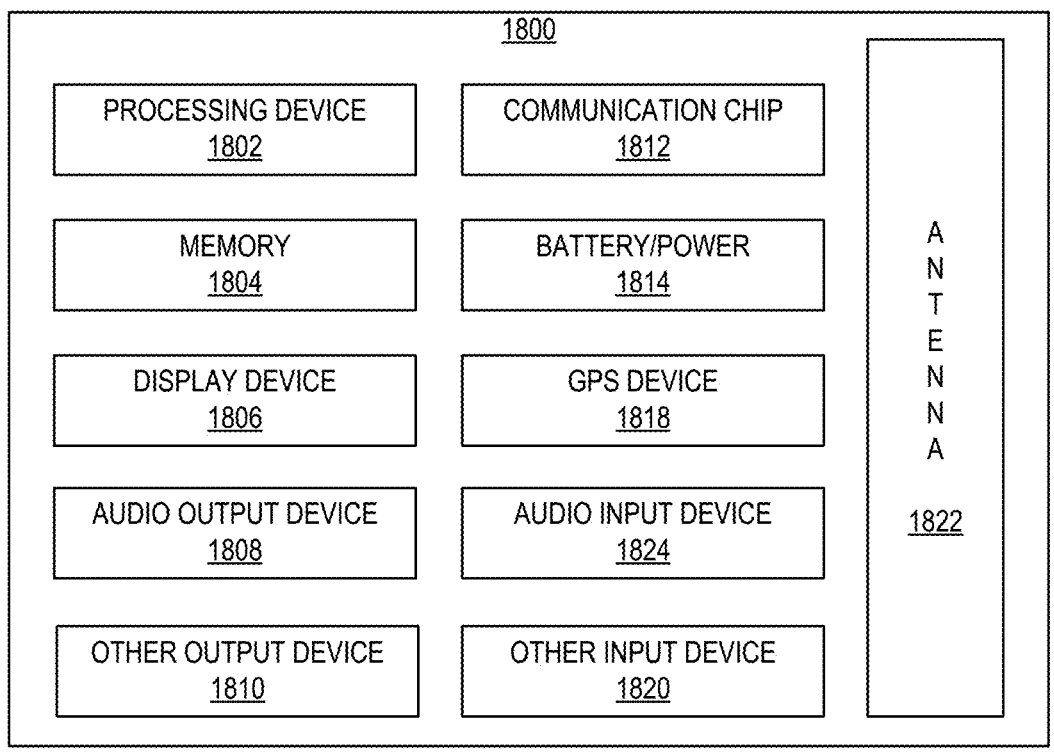
FIG. 9 is a block diagram of an example electrical device that may include an electronic assembly with a shield, in accordance with any of the embodiments disclosed herein.

The electronic assemblies 100 disclosed herein may include, or be included in, any suitable apparatus. FIGS. 7-9 illustrate various examples of apparatuses that may include, or be included in, any of the electronic assemblies 100 disclosed herein.

FIG. 7 is a top view of a wafer 1500 and dies 1502; the dies 1502 may be included in any of the electronic assemblies 100 disclosed herein (e.g., as an electronic component in an IC package 150, or otherwise coupled to a circuit board 102). The wafer 1500 may be composed of semiconductor material and may include one or more dies 1502 having IC structures (e.g., transistors, as discussed below) formed on a surface of the wafer 1500. Each of the dies 1502 may be a repeating unit of a semiconductor product that includes any suitable IC. After the fabrication of the semiconductor product is complete, the wafer 1500 may undergo a singulation process in which the dies 1502 are separated from one another to provide discrete "chips" of the semiconductor product. The die 1502 may include one or more transistors (e.g., the transistors 1640 of FIG. 8, discussed below), one or more passive components (e.g., resistors, capacitors, or inductors), and/or supporting circuitry to route electrical signals to the transistors and/or passive components, as well as any other IC components. In some embodiments, the wafer 1500 or the die 1502 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1502. For example, a memory array formed by multiple memory devices may be formed on a same die 1502 as a processing device (e.g., the processing device 1802 of FIG. 9) or other logic that is configured to store information in the memory devices or execute instructions stored in the memory array.

FIG. 8 is a cross-sectional side view of an IC device 1600 that may be included in any of the electronic assemblies 100 disclosed herein (e.g., as an electronic component in an IC package 150, or otherwise coupled to a circuit board 102). One or more of the IC devices 1600 may be included in one or more dies 1502 (FIG. 7). The IC device 1600 may be formed on a substrate 1602 (e.g., the wafer 1500 of FIG. 7) and may be included in a die (e.g., the die 1502 of FIG. 7). The substrate 1602 may be a semiconductor substrate composed of semiconductor material systems including, for example, n-type or p-type materials systems (or a combination of both). The substrate 1602 may include, for example, a crystalline substrate formed using a bulk silicon or a silicon-on-insulator (SOI) substructure. In some embodiments, the substrate 1602 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the substrate 1602. Although a few examples of materials from which the substrate 1602 may be formed are described here, any material that may serve as a foundation for an IC device 1600 may be used. The substrate 1602 may be part of a singulated die (e.g., the dies 1502 of FIG. 7) or a wafer (e.g., the wafer 1500 of FIG. 7).

The IC device 1600 may include one or more device layers 1604 disposed on the substrate 1602. The device layer 1604 may include features of one or more transistors 1640 (e.g., metal oxide semiconductor field-effect transistors (MOSFETs)) formed on the substrate 1602. The device layer 1604 may include, for example, one or more source and/or drain (S/D) regions 1620, a gate 1622 to control current flow in the transistors 1640 between the S/D regions 1620, and one or more S/D contacts 1624 to route electrical signals to/from the S/D regions 1620. The transistors 1640 may include additional features not depicted for the sake of clarity, such as device isolation regions, gate contacts, and the like. The transistors 1640 are not limited to the type and configuration depicted in FIG. 8 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon and nanowire transistors.

Each transistor 1640 may include a gate 1622 formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 1640 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 1640 along the source-channel-drain direction, the gate electrode may consist of a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may consist of a combination of U-shaped structures and planar, non-U-shaped structures.

For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 1620 may be formed within the substrate 1602 adjacent to the gate 1622 of each transistor 1640. The S/D regions 1620 may be formed using an implantation/diffusion process or an etching/deposition process, for example. In the former process, dopants such as boron, aluminum, antimony, phosphorous, or arsenic may be ion-implanted into the substrate 1602 to form the S/D regions 1620. An annealing process that activates the dopants and causes them to diffuse farther into the substrate 1602 may follow the ion-implantation process. In the latter process, the substrate 1602 may first be etched to form recesses at the locations of the S/D regions 1620. An epitaxial deposition process may then be carried out to fill the recesses with material that is used to fabricate the S/D regions 1620. In some implementations, the S/D regions 1620 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1620 may be formed using one or more alternate semiconductor materials such as germanium or a group III-V material or alloy. In further embodiments, one or more layers of metal and/or metal alloys may be used to form the S/D regions 1620.

Electrical signals, such as power and/or input/output (I/O) signals, may be routed to and/or from the devices (e.g., the transistors 1640) of the device layer 1604 through one or more interconnect layers disposed on the device layer 1604 (illustrated in FIG. 8 as interconnect layers 1606-1610). For example, electrically conductive features of the device layer 1604 (e.g., the gate 1622 and the S/D contacts 1624) may be electrically coupled with the interconnect structures 1628 of the interconnect layers 1606-1610. The one or more interconnect layers 1606-1610 may form a metallization stack (also referred to as an "ILD stack") 1619 of the IC device 1600.

The interconnect structures 1628 may be arranged within the interconnect layers 1606-1610 to route electrical signals according to a wide variety of designs (in particular, the arrangement is not limited to the particular configuration of interconnect structures 1628 depicted in FIG. 8). Although a particular number of interconnect layers 1606-1610 is depicted in FIG. 8, embodiments of the present disclosure include IC devices having more or fewer interconnect layers than depicted.

In some embodiments, the interconnect structures 1628 may include lines 1628a and/or vias 1628b filled with an electrically conductive material such as a metal. The lines 1628a may be arranged to route electrical signals in a direction of a plane that is substantially parallel with a surface of the substrate 1602 upon which the device layer 1604 is formed. For example, the lines 1628a may route electrical signals in a direction in and out of the page from the perspective of FIG. 8. The vias 1628b may be arranged to route electrical signals in a direction of a plane that is substantially perpendicular to the surface of the substrate 1602 upon which the device layer 1604 is formed. In some embodiments, the vias 1628b may electrically couple lines 1628a of different interconnect layers 1606-1610 together.

The interconnect layers 1606-1610 may include a dielectric material 1626 disposed between the interconnect structures 1628, as shown in FIG. 8. In some embodiments, the dielectric material 1626 disposed between the interconnect structures 1628 in different ones of the interconnect layers 1606-1610 may have different compositions; in other embodiments, the composition of the dielectric material 1626 between different interconnect layers 1606-1610 may be the same.

A first interconnect layer 1606 (referred to as Metal 1 or "M1") may be formed directly on the device layer 1604. In some embodiments, the first interconnect layer 1606 may include lines 1628a and/or vias 1628b, as shown. The lines 1628a of the first interconnect layer 1606 may be coupled with contacts (e.g., the S/D contacts 1624) of the device layer 1604.

A second interconnect layer 1608 (referred to as Metal 2 or "M2") may be formed directly on the first interconnect layer 1606. In some embodiments, the second interconnect layer 1608 may include vias 1628b to couple the lines 1628a of the second interconnect layer 1608 with the lines 1628a of the first interconnect layer 1606. Although the lines 1628a and the vias 1628b are structurally delineated with a line within each interconnect layer (e.g., within the second interconnect layer 1608) for the sake of clarity, the lines 1628a and the vias 1628b may be structurally and/or materially contiguous (e.g., simultaneously filled during a dual-damascene process) in some embodiments.

A third interconnect layer 1610 (referred to as Metal 3 or "M3") (and additional interconnect layers, as desired) may be formed in succession on the second interconnect layer 1608 according to similar techniques and configurations described in connection with the second interconnect layer 1608 or the first interconnect layer 1606. In some embodiments, the interconnect layers that are "higher up" in the metallization stack 1619 in the IC device 1600 (i.e., further away from the device layer 1604) may be thicker.

The IC device 1600 may include a solder resist material 1634 (e.g., polyimide or similar material) and one or more conductive contacts 1636 formed on the interconnect layers 1606-1610. In FIG. 8, the conductive contacts 1636 are illustrated as taking the form of bond pads. The conductive contacts 1636 may be electrically coupled with the interconnect structures 1628 and configured to route the electrical signals of the transistor(s) 1640 to other external devices. For example, solder bonds may be formed on the one or more conductive contacts 1636 to mechanically and/or electrically couple a chip including the IC device 1600 with another component (e.g., a circuit board). The IC device 1600 may include additional or alternate structures to route the electrical signals from the interconnect layers 1606-1610; for example, the conductive contacts 1636 may include other analogous features (e.g., posts) that route the electrical signals to external components.

FIG. 9 is a block diagram of an example electrical device 1800 that may include one or more electronic assemblies 100, in accordance with any of the embodiments disclosed herein. For example, any suitable ones of the components of the electrical device 1800 may include, or be included in, an electronic assembly 100. A number of components are illustrated in FIG. 9 as included in the electrical device 1800, but any one or more of these components may be omitted or duplicated, as suitable for the application. In some embodiments, some or all of the components included in the electrical device 1800 may be attached to one or more motherboards (e.g., the circuit board 102). For example, some or all of the components included in the electrical device 1800 may be included in IC packages 150 included in electronic assemblies 100 with shields 120, in accordance with any of the embodiments disclosed herein. In some embodiments, some or all of these components may be fabricated onto a single system-on-a-chip (SoC) die (and, in some embodiments, included in an IC package 150).

Additionally, in various embodiments, the electrical device 1800 may not include one or more of the components illustrated in FIG. 9, but the electrical device 1800 may include interface circuitry for coupling to the one or more components. For example, the electrical device 1800 may not include a display device 1806 but may include display device interface circuitry (e.g., a connector and driver circuitry) to which a display device 1806 may be coupled. In another set of examples, the electrical device 1800 may not include an audio input device 1824 or an audio output device 1808 but may include audio input or output device interface circuitry (e.g., connectors and supporting circuitry) to which an audio input device 1824 or audio output device 1808 may be coupled.

The electrical device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The electrical device 1800 may include a memory 1804, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 1804 may include memory that shares a die with the processing device 1802. This memory may be used as cache memory and may include embedded dynamic random access memory (eDRAM) or spin transfer torque magnetic random access memory (STT-MRAM).

In some embodiments, the electrical device 1800 may include a communication chip 1812 (e.g., one or more communication chips). For example, the communication chip 1812 may be configured for managing wireless communications for the transfer of data to and from the electrical device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other embodiments. The electrical device 1800 may include an antenna 1822 to facilitate wireless communications and/or to receive other wireless communications (such as AM or FM radio transmissions).

In some embodiments, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LTE, EV-DO, or others. In some embodiments, a first communication chip 1812 may be dedicated to wireless communications, and a second communication chip 1812 may be dedicated to wired communications.

The electrical device 1800 may include battery/power circuitry 1814. The battery/power circuitry 1814 may include one or more energy storage devices (e.g., batteries or capacitors) and/or circuitry for coupling components of the electrical device 1800 to an energy source separate from the electrical device 1800 (e.g., AC line power).

The electrical device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display.

The electrical device 1800 may include an audio output device 1808 (or corresponding interface circuitry, as discussed above). The audio output device 1808 may include any device that generates an audible indicator, such as speakers, headsets, or earbuds.

The electrical device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The electrical device 1800 may include a GPS device 1818 (or corresponding interface circuitry, as discussed above). The GPS device 1818 may be in communication with a satellite-based system and may receive a location of the electrical device 1800, as known in the art.

The electrical device 1800 may include an other output device 1810 (or corresponding interface circuitry, as discussed above). Examples of the other output device 1810 may include an audio codec, a video codec, a printer, a wired or wireless transmitter for providing information to other devices, or an additional storage device.

The electrical device 1800 may include an other input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1800 may have any desired form factor, such as a handheld or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server or other networked computing component, a printer, a scanner, a monitor, a set-top box, an entertainment control unit, a vehicle control unit, a digital camera, a digital video recorder, or a wearable electrical device. In some embodiments, the electrical device 1800 may be any other electronic device that processes data.

The following paragraphs provide various examples of the embodiments disclosed herein.

Example 1 is an electronic assembly, including: a circuit board having a hole extending therethrough, wherein the circuit board has a first face and a second opposing face; and a shield coupled to the second face of the circuit board, wherein the shield extends into the hole towards the first face.

Example 2 may include the subject matter of Example 1, and may further include an integrated circuit (IC) package coupled to the second face of the circuit board, wherein the shield includes a cavity that is at least partially in the hole, the IC package includes a package substrate and an electronic component coupled to the package substrate, and the electronic component extends into the cavity.

Example 3 may include the subject matter of Example 2, and may further include a thermal interface material between the electronic component and the shield.

Example 4 may include the subject matter of any of Examples 2-3, and may further specify that the electronic component is a first electronic component, the electronic component is coupled to a first face of the package substrate, the package substrate has a second opposing face, and the IC package further includes a second electronic component coupled to the second face of the package substrate.

Example 5 may include the subject matter of any of Examples 2-4, and may further specify that the package substrate includes a conductive pathway conductively coupled to the shield.

Example 6 may include the subject matter of Example 5, and may further specify that the shield is coupled to the first face of the package substrate with a conductive material.

Example 7 may include the subject matter of Example 6, and may further specify that the conductive material includes solder.

Example 8 may include the subject matter of any of Examples 6-7, and may further specify that the shield is coupled to a conductive contact on the second face of the circuit board with solder paste.

Example 9 may include the subject matter of any of Examples 5-8, and may further specify that the circuit board includes a conductive pathway conductively coupled to the shield.

Example 10 may include the subject matter of Example 9, and may further specify that the conductive pathway of the package substrate is conductively coupled to the conductive pathway of the circuit board.

Example 11 may include the subject matter of any of Examples 2-10, and may further specify that the electronic component includes a die, a capacitor, an inductor, or a voltage regulator.

Example 12 may include the subject matter of any of Examples 2-11, and may further specify that the IC package has a footprint that is smaller than 50 millimeters by 50 millimeters.

Example 13 may include the subject matter of any of Examples 1-12, and may further specify that the shield includes steel, tin, aluminum, nickel, or silver.

Example 14 is an electronic assembly, including: a circuit board having a hole extending therethrough, wherein the circuit board has a first face and a second opposing face; and a shield coupled to the second face of the circuit board, wherein the shield includes a cavity and the cavity is at least partially in the hole.

Example 15 may include the subject matter of Example 14, and may further specify that the shield extends through the hole and beyond a plane of the first face.

Example 16 may include the subject matter of Example 14, and may further specify that the shield does not extend beyond a plane of the first face.

Example 17 may include the subject matter of any of Examples 14-16, and may further specify that the shield has a thickness between 75 microns and 200 microns.

Example 18 may include the subject matter of any of Examples 14-17, and may further specify that the hole has a footprint that is smaller than 20 millimeters by 20 millimeters.

Example 19 may include the subject matter of any of Examples 14-18, and may further specify that the circuit board has a thickness between 0.3 millimeters and 2 millimeters.

Example 20 may include the subject matter of any of Examples 14-19, and may further specify that the circuit board is a motherboard.

Example 21 may include the subject matter of any of Examples 14-20, and may further specify that the shield is coupled to a conductive contact on the second face of the circuit board with solder paste.

Example 22 may include the subject matter of any of Examples 14-21, and may further include an integrated circuit (IC) package coupled to the circuit board, wherein the IC package includes a package substrate and an electronic component coupled to the package substrate, and the electronic component extends into the cavity.

Example 23 is a method of manufacturing an electronic assembly, including: bringing a shield into contact with solder material on a circuit board, wherein the circuit board has a hole extending therethrough, and the shield has a cavity that, when the shield is brought into contact with the circuit board, extends into the hole; and reflowing the solder material to secure the shield to the circuit board.

Example 24 may include the subject matter of Example 23, and may further specify that the shield is brought into contact with the solder material using a pick-and-place machine.

Example 25 may include the subject matter of any of Examples 23-24, and may further include providing a thermal interface material in the cavity of the shield.

Example 26 may include the subject matter of any of Examples 23-25, and may further include before reflowing the solder, bringing an integrated circuit (IC) package into contact with the circuit board, wherein the IC package and the shield are brought into contact with a same face of the circuit board, and a solder material is between the IC package and the circuit board; wherein reflowing the solder material secures the IC package to the circuit board.

Example 27 may include the subject matter of Example 26, and may further specify that the IC package is a ball grid array package.

Example 28 may include the subject matter of any of Examples 26-27, and may further specify that the IC package includes larger solder balls and smaller solder balls before reflow, and bringing the IC package into contact with the circuit board includes bringing the larger solder balls into contact with the circuit board and bringing the smaller solder balls into contact with the shield.

Example 29 may include the subject matter of any of Examples 26-28, and may further specify that the IC package includes an electronic component that, when the IC package is brought into contact with the circuit board, extends into the cavity.

Example 30 may include the subject matter of any of Examples 23-29, and may further include forming the shield by stamping a metal sheet.

Example 31 is a computing device, including: a circuit board having a hole extending therethrough, wherein the circuit board has a first face and a second opposing face; a shield coupled to the second face of the circuit board, wherein the shield includes a cavity and the cavity is at least partially in the hole; and an integrated circuit (IC) package coupled to the second face of the circuit board, wherein the IC package includes a package substrate and an electronic component coupled to the package substrate, and the electronic component extends into the cavity.

Example 32 may include the subject matter of Example 31, and may further specify that the computing device is a laptop computing device.

Example 33 may include the subject matter of any of Examples 31-32, and may further specify that the electronic component includes a die, a capacitor, an inductor, or a voltage regulator.

Example 34 may include the subject matter of any of Examples 31-33, and may further include a thermal interface material between the shield and the electronic component.

The invention claimed is:

1. An electronic assembly, comprising:
a circuit board having a hole extending therethrough, wherein the circuit board has a first face and a second face opposite to the first face;
a shield coupled to the second face of the circuit board by a first interconnect, wherein the first interconnect includes solder in contact with a peripheral region of the shield and the second face of the circuit board, wherein the shield extends into the hole towards the first face, and the peripheral region of the shield is oriented parallel to the second face of the circuit board; and
an integrated circuit (IC) package coupled to the second face of the circuit board by a second interconnect, wherein the IC package includes a package substrate and an electronic component coupled to the package substrate, the peripheral region is at least partially between the circuit board and the package substrate, the shield includes a cavity that is at least partially in the hole, the electronic component extends into the cavity, the second interconnect has a height that is greater than a height of the first interconnect, and the second interconnect has a different material arrangement than the first interconnect.

2. The electronic assembly of claim 1, further comprising:
a thermal interface material between the electronic component and the shield.

3. The electronic assembly of claim 1, wherein the electronic component is a first electronic component, the electronic component is coupled to a first face of the package substrate, the package substrate has a second opposing face, and the IC package further includes a second electronic component coupled to the second face of the package substrate.

4. The electronic assembly of claim 1, wherein the package substrate includes a conductive pathway conductively coupled to the shield.

5. The electronic assembly of claim 4, wherein the shield is coupled to the first face of the package substrate with a conductive material.

6. The electronic assembly of claim 4, wherein the circuit board includes a conductive pathway conductively coupled to the shield.

7. The electronic assembly of claim 6, wherein the conductive pathway of the package substrate is conductively coupled to the conductive pathway of the circuit board.

8. The electronic assembly of claim 1, wherein the electronic component includes a die, a capacitor, an inductor, or a voltage regulator.

9. The electronic assembly of claim 1, wherein the shield includes steel, tin, aluminum, nickel, or silver.

10. An electronic assembly, comprising:
a circuit board having a hole extending therethrough, wherein the circuit board has a first face and a second face opposite to the first face; and
a shield coupled to the second face of the circuit board, wherein the shield includes a cavity and the cavity is at least partially in the hole, and the shield is coupled to a conductive contact on the second face of the circuit board by a first interconnect; and
an integrated circuit (IC) package coupled to the circuit board by a second interconnect, wherein a portion of the shield is between the circuit board and a package substrate of the IC package, the shield is spaced away from the package substrate, the second interconnect has a height that is greater than a height of the first interconnect, and the second interconnect has a different structure than the first interconnect.

11. The electronic assembly of claim 10, wherein the shield extends through the hole and beyond a plane of the first face.

12. The electronic assembly of claim 10, wherein the shield does not extend beyond a plane of the first face.

13. The electronic assembly of claim 10, wherein the circuit board is a motherboard.

14. The electronic assembly of claim 10, wherein the IC package includes an electronic component coupled to the package substrate, and the electronic component extends into the cavity.

15. A computing device, comprising:
- a circuit board having a hole extending therethrough, wherein the circuit board has a first face and a second face opposite to the first face;
- a shield coupled to the second face of the circuit board by a first interconnect in contact with a peripheral region of the shield and the second face of the circuit board, wherein the shield includes a cavity and the cavity is at least partially in the hole, and the peripheral region of the shield is oriented parallel to the second face of the circuit board; and
- an integrated circuit (IC) package coupled to the second face of the circuit board by a second interconnect, wherein the IC package includes a package substrate and an electronic component coupled to the package substrate, the electronic component extends into the cavity, the shield is spaced away from the package substrate, the second interconnect has a height that is greater than a height of the first interconnect, and the second interconnect has a different shape than the first interconnect.

16. The computing device of claim 15, wherein the computing device is a laptop computing device.

17. The computing device of claim 15, wherein the electronic component includes a die, a capacitor, an inductor, or a voltage regulator.

18. The computing device of claim 15, wherein a material of the first interconnect includes solder.

19. The computing device of claim 15, wherein the shield does not extend beyond a plane of the first face.

20. The electronic assembly of claim 1, wherein the shield is spaced away from the package substrate.

21. The electronic assembly of claim 1, wherein solder is between the shield and the package substrate.

22. The electronic assembly of claim 10, wherein the first interconnect includes solder.

23. The electronic assembly of claim 22, wherein the solder includes solder paste.

24. The electronic assembly of claim 10, wherein solder is between the shield and the package substrate.

* * * * *